United States Patent

Paranjpe

[11] Patent Number: 6,034,356
[45] Date of Patent: Mar. 7, 2000

[54] RTP LAMP DESIGN FOR OXIDATION AND ANNEALING

[75] Inventor: Ajit Pramod Paranjpe, Sunnyvale, Calif.

[73] Assignee: Texas Instruments Incorporated, Dallas, Tex.

[21] Appl. No.: 09/007,164

[22] Filed: Jan. 14, 1998

Related U.S. Application Data

[62] Division of application No. 08/756,632, Nov. 26, 1996.

[51] Int. Cl.$^7$ ...................................................... F27B 5/14
[52] U.S. Cl. ............................ 219/390; 219/405; 219/411
[58] Field of Search .................................. 219/390, 405, 219/411; 392/416, 422; 250/492.2; 362/304, 297; 118/724, 725, 50.1; 438/795

[56] References Cited

U.S. PATENT DOCUMENTS

| | | | |
|---|---|---|---|
| 4,468,260 | 8/1984 | Hiramoto | 148/1.5 |
| 4,469,529 | 9/1984 | Mirmura | 148/1.5 |
| 4,481,406 | 11/1984 | Muka | 219/411 |
| 4,535,228 | 8/1985 | Mimura et al. | 219/411 |
| 4,956,538 | 9/1990 | Moslehi | 219/121.6 |
| 5,315,092 | 5/1994 | Takahashi et al. | 219/497 |
| 5,418,885 | 5/1995 | Hauser et al. | 392/416 |
| 5,719,991 | 2/1998 | Sandhu et al. | 392/416 |
| 5,848,889 | 12/1998 | Tietz et al. | 432/258 |

FOREIGN PATENT DOCUMENTS 4-245425  9/1992  Japan.

*Primary Examiner*—John A. Jeffery
*Assistant Examiner*—Shawntina T. Fuqua
*Attorney, Agent, or Firm*—Jacqueline J. Garner; Wade James Brady, III; Richard L. Donaldson

[57] ABSTRACT

A RTP system and method. A first lamp zone (108) is located around a periphery of a wafer (102) for heating the center of the wafer (102) and a second lamp zone (114) is located around the periphery of the wafer (102) for heating the edge of the wafer (102). The chamber (104) includes highly reflective surfaces (106). Light from the first and second lamp zones (108, 114) is reflected off of the highly reflective surfaces (106) at least three time before reaching the wafer (102). Thus, the wafer (102) is isotropically heated and uniform wafer heating is achieved.

6 Claims, 1 Drawing Sheet

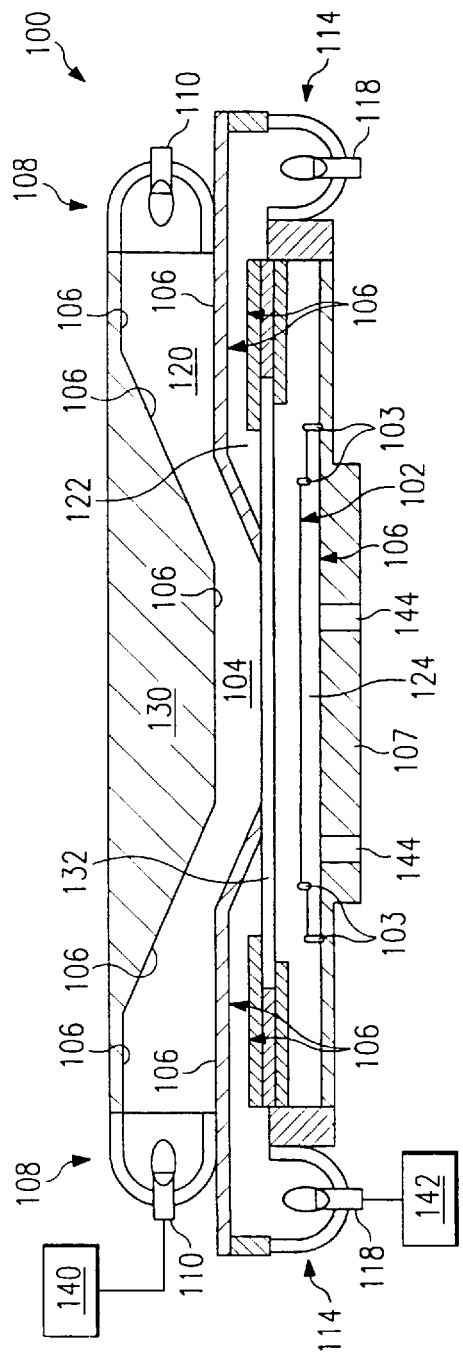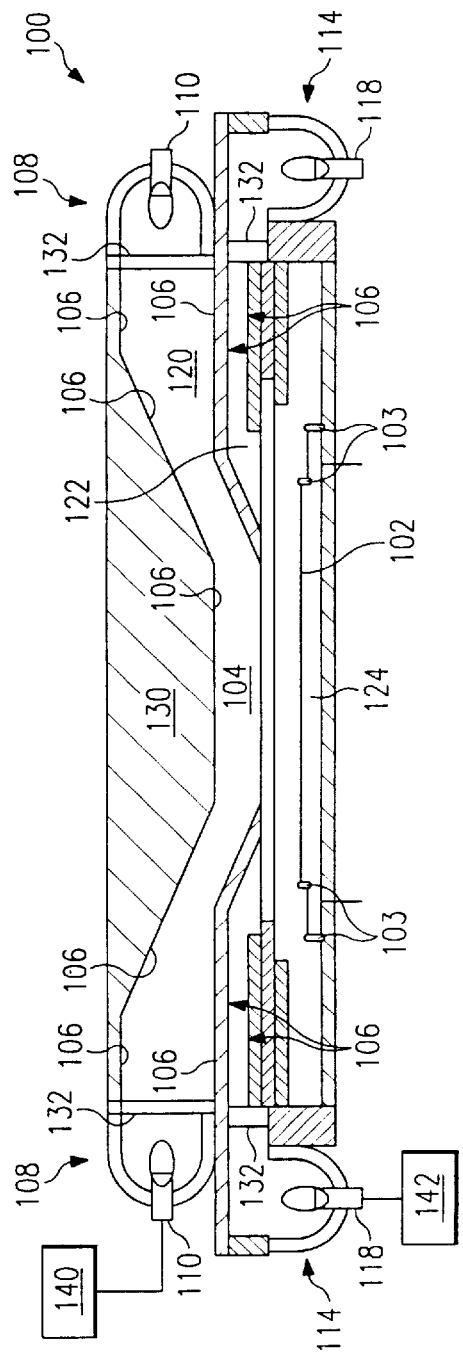

RTP LAMP DESIGN FOR OXIDATION AND ANNEALING

This is a divisional application of Ser. No. 08/756,632 filed Nov. 26, 1996.

FIELD OF THE INVENTION

This invention generally relates to semiconductor processing and more specifically to rapid thermal processing (RTP).

BACKGROUND OF THE INVENTION

Rapid thermal processing (RTP) is rapidly becoming the technology of choice for oxidation and annealing steps in advanced ultra-large scale integration (ULSI) fabrication. The ability to subject the wafer to short (typically less than 60 sec.), high temperature (500–1200° C.) heat treatments leads to significant device performance improvement over an equivalent process performed in a high temperature furnace. Ramp rates for most RTP systems range from 20–100° C./s compared to 5–10° C./min for a conventional furnace. The high ramp rate capability of the RTP system provides a significant advantage over a furnace. For example, a RTP process for source/drain annealing which is typically performed at 950–1050° C. for 30 s provides much higher dopant activation, lower residual damage and shallower junctions compared to an 850° C., 30 min. anneal in a furnace. Similarly, thin thermal oxides grown by RTP at 1000–1050° C. are more reliable than those grown at 850–900° C. in a furnace. The short thermal cycle of RTP makes it possible to grow oxides or anneal implants without significant redistribution of dopants. Another advantage of RTP over a conventional furnace is better ambient control (i.e. lower contamination) and reduced processing pressures. Thus, nitrided oxides which are obtained by growing oxides in a $NO/O_2$ or a $N_2O/O_2$ ambient can easily be grown by RTP. RTP also provides a significant advantage for titanium silicide formation and anneal. Increasing formation temperature, while reducing the formation time, increases the ratio of silicide to TiN that is formed, while also reducing undesirable lateral overgrowth. A 650–700° C., 30–60 s RTP silicide formation provides a thicker silicide than a 550–600° C. 30–60 min. furnace process. RTP also plays an important role in silicide annealing. During silicide formation, the high resistivity C49 phase is created and must be transformed to the lower resistivity C54 phase by annealing. Since the activation energy for this transformation is fairly high, and increases with decreasing feature size, a high temperature anneal at 800–850° C. is necessary to accomplish the transformation. However, a short (15–30 s) process time must be used to prevent uptake of dopant from the underlying material into the undoped silicide. RTP is also suitable for CVD processes, since higher temperatures can be used to enhance the deposition rates and hence throughput. RTP also enables the use of single wafer processing and associated single wafer process control. Single wafer processing is clearly gaining ground as the need to cluster processes and increase wafer size grows.

Despite the process advantages, RTP systems are plagued primarily by equipment limitations. The biggest bane is temperature control and uniformity. The slow ramp rates of a furnace ensure that all elements are in thermal equilibrium which results in a uniform temperature distribution. In an RTP system, only the wafer is directly heated, while the reactor chamber and the ambient remain cool. High temperature ramp rates can be achieved because of direct wafer heating, but this also results in large temperature gradients in the RTP system. Typically, elaborate multi-zone lamps arranged in a linear or circular array are used to radiantly heat the wafer. The multi-zone lamps are typically located directly above or below the wafer. Multi-point pyrometry is necessary to measure wafer temperature distribution across the wafer and to control the power to each of the lamp zones, so that uniform wafer temperature distribution is obtained. Non-uniform wafer emissivity, wafer to wafer variation in emissivity, and variation of wafer emissivity with temperature further complicate uniform wafer heating and pyrometric temperature measurement. Although engineering solutions have been developed for many of these problems, they generally increase system cost and complexity.

TECHNICAL ADVANTAGES OF THE INVENTION

An advantage of the invention is providing a RTP system that isotropically heats the wafer to be processed.

A further advantage of the invention is providing a RTP system having improved temperature uniformity.

A further advantage of the invention is providing a RTP system that eliminates emissivity dependence for temperature measurement.

A further advantage of the invention is providing a RTP system having a simpler heat control system.

These and other advantages will be apparent to those of ordinary skill in the art having reference to the specification in conjunction with the drawings and claims.

BRIEF DESCRIPTION OF THE DRAWINGS

In the drawings:

FIG. 1 is a block diagram of a RTP system according to one embodiment of the invention; and FIG. 2 is a block diagram of a RTP system according to an alternate embodiment of the invention.

Corresponding numerals and symbols in the different figures refer to corresponding parts unless otherwise indicated.

DETAILED DESCRIPTION OF PREFERRED EMBODIMENTS

An RTP system 100 according to an embodiment of the invention is shown in FIG. 1. RTP system 100 is a single wafer processing system. It is used to provide a rapid intense heat treatment of a wafer for processes such as annealing and oxidation. Other processes for which the benefits of the invention may be used will be apparent to those skilled in the art.

A wafer 102 is enclosed in a small chamber 104. Wafer 102 is held front side down by slip rings 103 which also help to prevent temperature discontinuity and slip at the edge of wafer 102. The walls of chamber 104 have highly reflective surfaces 106. Showerhead assembly 107, through which process gases are distributed, is also polished to have a highly reflective surface 106. The wafer 102 is located such that it is bounded on all sides by highly reflective surfaces 106. Chamber 104 thus constitutes a black body environment.

A first zone of a radiant energy source 108 is placed around the periphery of the chamber 104. In the preferred embodiment, the first zone of radiant energy source 108 comprises lamps 110. Radiation from the first zone of lamps 108 is directed into the black body environment of chamber 104 for heating the center of wafer 102. FIG. 1 shows a single row of lamps 110 circling chamber 104. The first zone of lamps 108 could alternatively comprise multiple rows of lamps 110. Furthermore, lamps 110 of FIG. 1 are shown oriented parallel to the plane of wafer 102. This orientation may be altered as long as 90–95% of the radiation from lamps 110 is directed into chamber 104. Conventional RTP lamps, such as tungsten-halogen lamps, may be used. Of course, other sources of radiant energy, such as heated silicon-carbide shields, may alternatively be used.

A second zone of a radiant energy source 114 is also placed around the periphery of chamber 104. In the preferred embodiment, the second zone of radiant energy 114 also comprises lamps. Radiation from the second zone of lamps 114 is designed to heat the outer edges of wafer 102. Lamps 118 of second zone 114 are illustrated as oriented perpendicular to the plane of wafer 102. As will be apparent to those skilled in the art, the orientation of lamps 118 may also be altered and several rows of lamps 118 may alternatively be used. Other sources of radiant energy may also be used for the second zone of lamps 114.

The first and second zones of lamps (108 and 114) are independently powered by supplies 140 and 142 respectively. Thus, the relative power supplied between the first (108) and second (114) zones may be adjusted for uniform temperature distribution. Temperature measurement devices 144, such as pyrometers, may be located either on the front side or backside of the wafer 102. FIG. 1 illustrates temperature measurement devices 144 on the front side.

Chamber 104 comprises three regions center heating region 120, edge heating region 122, and processing region 124. Radiation from the first zone of lamps is directed into center heating region 120. Region 120 is contoured such that light from each of lamps 110 is reflected at least three times before reaching wafer 102 and to achieve the same distribution of angles of light across wafer 102. It is desired that region 120 be compact to establish an isotropic radiation field. Region 120 directs radiation to the center of wafer 102. Radiation from the second zone of lamps is directed into edge heating region 122. Region 122 is also contoured such that light from each of lamps 118 is reflected at least three times before reaching wafer 102 and to achieve the same distribution of angles of light across wafer 102. It is desired that region 122 is also compact to establish an isotropic radiation field. Region 122 directs the radiation to the outer edges of wafer 102. Other contours for regions 120 and 122 will be apparent to those skilled in the art. The desired process gases, if any, are supplied to processing region 124 through showerhead assembly 107.

Quartz window 132 is placed between lamps 110 and 118 and wafer 102. For example, quartz window 132 may be placed adjacent the back side of wafer 102. This separates processing region 124 from heating regions 120 and 122 and thus prevents metal from the highly reflective surfaces 106 on the chamber walls of regions 120 and 122 from entering processing region 124. Quartz window 132 also prevents process gas from entering regions 120 and 122. Quartz window 132 is preferably thin to minimize absorption of lamp radiation. To prevent cracking of the quartz window 132, dynamic pressure equalization should be provided between regions 120, 122, and 124.

In an alternative embodiment, quartz window 132 may be placed adjacent lamps 110 and 118. This configuration is preferred due to better performance characteristics, but may only be used in inert ambients, such as for annealing. Quartz window 132 tends to heat up gradually during the course of a multiple wafer run. If quartz window 132 is in close proximity to the wafer 102, process reproducibility is degraded. Also, pyrometry is more accurate if there is not a window in the optical path between the wafer and the pyrometer. If the RTP system 100 is to be used solely for annealing purposes, showerhead assembly 107 may be omitted since process gases are not desired. However, it is important that wafer 102 still face a highly reflective surface 106. Such a system is shown in FIG. 2.

Referring to either FIGS. 1 or 2, reflective surfaces 106 may, for example, comprise a polished reflective metal. Gold is preferred. It is desirable for the reflective surfaces 106 to absorb less than 2% of the radiation from lamps 110 and 118. Consequently, at least the upper wall 130 of chamber 104 is cooled. Preferably, all the walls are cooled. For example, water cooling pipes may be run through the walls.

In operation, once wafer 102 is placed within chamber 104, lamps 110 and 118 are powered to heat wafer 102 for the desired RTP process. Due to the black body environment of chamber 104, light is reflected off of the reflective surfaces 106. Lamp light is reflected at least three times before reaching wafer 102. This establishes an isotropic radiation field inside chamber 104 and direct heating of the wafer is avoided. For perfectly reflective surfaces (i.e., 100% reflectivity), all the light that enters the chamber 104 is absorbed by the wafer 102 thereby enhancing the thermal efficiency of the system 100. In contrast, prior art RTP systems lose most of the lamp light to the chamber walls. Because at most 2% of the light is absorbed by the reflective surfaces 106 in the present embodiment, the present embodiment offers a significantly higher thermal efficiency than prior art systems.

Theoretically, it can be shown that the temperature distribution across a wafer 102 that is located in an black body environment with a uniform radiation field is uniform and is independent of the emissivity of the wafer surface. However, this condition is violated at the edge of the wafer 102 due to edge heat losses. The theoretical violation is corrected in the present embodiment by providing the first and second zones of lamps 108. The first zone of lamps 108 heats the center of the wafer 102 while the second zone of lamps 114 heats the edge of wafer 102. To achieve temperature uniformity, the temperature is sensed at the center of the wafer 102 and the edge of the wafer 102 using temperature measurement devices 144. The relative power to the two zones is then adjusted to provide uniform temperature distribution.

Temperature measurement is significantly simplified over prior art systems. For example, for pyrometry, the radiation collected by the pyrometer (temperature measurement device 144) corresponds to the Plank function at the wafer temperature with an emissivity of unity. Since the wafer 102 is contained in a black body environment, its effective emissivity is unity and no corrections for the emissivity variations (either intra-wafer, inter-wafer or during process) of the wafer are necessary. In contrast, prior art systems required complicated mechanisms for correcting for emissivity variations of a wafer.

Superimposed on the wafer radiation collected by the pyrometer is the lamp radiation. Lamp radiation is easily filtered out by time modulating the lamps, filtering the incoming lamp radiation around the wavelength interval of the temperature measurement device 144, or choosing a lamp that does not emit radiation at the wavelength of the temperature measurement device. Such methods are well known in the art.

The first (108) and second (114) zones of lamps heat wafer 102 to the desired temperature. For example, the desired temperature may be in the range of 550–1200° C. at a ramp rate on the order of 20–50° C./s. Any desired process gases may then be introduced through showerhead assembly 107 as is conventional. The duration of the heat treatment is also determined conventionally. After the appropriate duration, the temperature is ramped back down by reducing/eliminating power to lamps 110 and 118 and wafer 102 is removed from system 100.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for rapid thermal processing of a wafer in a chamber having reflective surfaces, comprising the steps of:

providing a first zone of radiant energy sources circling a periphery of said wafer;

directing light from said first zone of radiant energy source to said reflective surfaces in order to isotropically heat a center region of said wafer;

providing a second zone of radiant energy source circling said periphery of said wafer; and directing light from said second zone of radiant energy source to said reflective surfaces in order to isotropically heat an edge region of said wafer.

2. The method of claim 1, wherein said first zone of radiant energy source comprises a first zone of lamps and said second zone of energy source comprises a second zone of lamps.

3. The method of claim 2, wherein said step of directing light from said first zone of lamps comprises the step of reflecting light at least three time before said light reaches said wafer.

4. The method of claim 2, further comprising the steps of:

providing power to said first zone of lamps with a first power supply; and providing power to said second zone of lamps with a second power supply.

5. The method of claim 4, further comprising the step of;

providing a first temperature measurement device proximate said center region of said wafer;

providing a second temperature measurement device proximate said edge region of said wafer;

collecting radiation from the wafer with an effective emissivity of close to unity with said first and second temperature measurement devices;

adjusting the first and second power supplies in response to said collecting wafer radiation step to provide uniform heating of said wafer.

6. A method for rapid thermal processing of a wafer in a chamber having reflective surfaces, comprising the steps of:

providing a first zone of radiant energy source circling a periphery of said wafer;

directing light from said first zone of radiant energy source to said reflective surfaces in order to isotropically heat a center region of said wafer, wherein all radiation from said first zone of radiant energy source that enters said chamber is reflected;

providing a second zone of radiant energy source circling said periphery of said wafer; and directing light from said second zone of radiant energy source to said reflective surfaces in order to isotropically heat an edge region of said wafer.

* * * * *